United States Patent [19]

Tecle

[11] Patent Number: 4,941,929
[45] Date of Patent: Jul. 17, 1990

[54] SOLDER PASTE FORMULATION CONTAINING STANNOUS FLUORIDE

[75] Inventor: Berhan Tecle, Wilmington, Del.

[73] Assignee: E. I. Du Pont de Nemours and Company, Wilmington, Del.

[21] Appl. No.: 398,195

[22] Filed: Aug. 24, 1989

[51] Int. Cl.$^5$ ............................................. B23K 35/34
[52] U.S. Cl. ........................................ 148/24; 148/26
[58] Field of Search ..................................... 148/24, 26

[56] References Cited

U.S. PATENT DOCUMENTS

| | | | |
|---|---|---|---|
| 2,788,303 | 4/1957 | Ballard | 148/26 |
| 3,988,175 | 10/1976 | Baker | 148/26 |
| 4,867,800 | 9/1989 | Dishart et al. | 134/40 |

FOREIGN PATENT DOCUMENTS

| | | | |
|---|---|---|---|
| 62-16898 | 1/1987 | Japan | 23/35 |
| 64-40197 | 2/1989 | Japan | 23/35 |

*Primary Examiner*—Peter D. Rosenberg

[57] ABSTRACT

An improved solder paste composition suitable for screen or stencil printing with a capability for low ionic contamination after soldering comprising a metal or metal alloy powder, a carrier, and stannous fluoride.

20 Claims, No Drawings

SOLDER PASTE FORMULATION CONTAINING STANNOUS FLUORIDE

TECHNICAL FIELD

This invention relates to improved solder paste formulations and their use with electronic materials. More particularly, this invention relates to improved solder paste formulations containing a metal or metal alloy solder powder, a carrier and stannous fluoride. Such formulations allow reduced ionic contamination after a soldering operation which enables elimination of post-treatment use of a cleaning agent.

BACKGROUND OF THE INVENTION

Generally, the soldering of metals is effected by applying a soldering medium or flux on the place to be soldered, and then applying the solder with a soldering iron or the like. Alternatively, solder preforms have been used wherein a preform is heated to a molten state whereby it forms a good solder bond. Various preforms must be made for each individual situation. Consequently, the entire soldering process is very time consuming and expensive.

Various attempts have been made to produce printable (e.g. by screen or stencil techniques) solder compositions or pastes. The use of solder pastes which are composed of powdered solder alloy dispersed in a relatively small volume of a vehicle, is experiencing wider acceptance in industry primarily because pastes are more readily adapted to automated manufacturing procedures, than are the conventional manually operated solder solder bar, separate flux and iron or torch, or solder wire containing flux in a core within the wire and an iron or torch. The make-up of prior solder paste compositions has been influenced largely by prior practices, particularly in respect to fluxing or other surface preparing agents. These have comprised substantial portions of organic acids, inorganic acids and salts thereof, e.g., zinc chloride, ammonium chloride, and an additional alkali metal halide or ammonium halide other than chloride, either in dry form or mixed in a suitable solvent. However, the additional alkali metal halide or ammonium halide when added to the conventional zinc chloride, ammonium chloride flux has been found to either leave an undesirable corrosive halide residue on the metal surface or has resulted in a roughened surface on the finally joined members.

Japanese No. 64[1989]-40197 discloses a flux consisting of 1-20 weight % of tin fluoride and the balance of potassium fluoroaluminate complex. It is stated that use of greater than 20% of the tin fluoride results in the brazing properties being degraded, and use of less than 1% results in the effect being insignificant.

Japanese No. 62[1987]-16898 discloses a type of flux for soldering characterized in that it contains stannous fluoride as the activator for the soldering flux. The stannous fluoride is used in combination with well known binders such as rosin, rosin phenol, polyethylene glycol, etc. The fluxes are used in combination with solder baths.

U.S. patent application, Ser. No. 07/222,496 filed 7/21/88 and now U.S. Pat. No. 4,867,800 discloses in reflow soldering, a solder paste, containing both flux and solder metal in powder form, is applied only to the points where solder bonds are to be made. However, these pastes have been found to require the use of cleaning agents which still leave some ionic contamination after cleaning. Other cleaning agents such as chlorofluorocarbon (CFC) solvents remove all residual ionic contaminants after the soldering operation but have an undesirable environmental effect.

It has been found that the above disadvantages can be overcome and improved solder pastes having low ionic contamination after use of the paste in a soldering operation can be prepared by adding stannous fluoride to conventional solder pastes comprising a metal or metal alloy solder powder and a carrier or paste vehicle.

SUMMARY OF THE INVENTION

In accordance with this invention there is provided an improved solder paste composition suitable for screen or stencil printing with the capability for low ionic contamination after use of the paste in a soldering operation comprising (a) a metal or metal alloy solder powder, (b) a carrier or paste vehicle, and (c) stannous fluoride which composition after soldering and without a cleaning step has a low ionic contamination not greater than 2 micrograms NaCl equivalent/sq. inch.

DETAILED DESCRIPTION OF THE INVENTION

The improved screen or stencil printable solder paste compositions of the invention result in low ionic contamination after their use in a soldering operation. This is important because the best cleaning solvents used to remove ionic contaminants from printed circuit boards after the soldering operation are chlorofluorocarbon (CFC) solvents which are considered to present a threat to the environment because of their involvement in stratospheric ozone depletion.

Residual ionic contamination not greater than 2 micrograms NaCl equivalent/sq. inch was obtained when paste formulations having stannous fluoride and no other ingredient contributing to ionic contamination were used. Residual ionic contamination was determined using the military specification method MIL-P-28809 in an "Omega Meter" 600. 600 ml of 75 weight % isopropyl alcohol and 25 weight % water were used in a 15 minute test.

The screen or stencil printable solder paste compositions of the invention contain finely divided solder metals dispersed in the carrier or paste vehicle. The solder metals may be any of the conventional single or multi-phase metals normally used for soldering, including gold, silver, tin, germanium, silicon, antimony, bismuth, lead, indium, gallium, zinc, copper, phosphorous, alloys thereof or mixtures thereof. The solder metal particles are normally smaller than a 100 mesh, and preferably smaller than 200 mesh. When using mixtures of metals or their alloys, by modifying the amount of each it is possible to adjust the melting point, tensile strength, fluidity, shear strength, elongation, Brinell hardness and density, etc., to suit the purpose for which the solder paste is intended. Conventional metal or metal alloy solder powders used for electronic parts include a 63% Sn—Pb solder, a 55% Sn—Pb solder or a 5% Ag—Sn solder. Other metal or metal alloy solders known to those skilled in the art may also be used. Paste components and amounts of the components should be carefully selected when alloys having a high lead content which results in their having a high liquidus temperature (280° C.) are used.

These metal or metal alloy solders may be partially or completely coated with a layer of stannous fluoride. This prevents surface oxidation of the solder thus increasing its shelf life.

Solder powders are produced under inert conditions to prevent oxidation of the powder particles. The oxide should be a minimum to facilitate the rapid coalescence of the individual solder particles. Molten stannous fluoride may be delivered to the atomized solder as mist which coats the solder particles. The coated particles may then be used as is in preparing the solder paste with the added advantage of having the stannous fluoride coating which allows the solder to be applied to a flux-free substrate which is to be soldered. This approach offers the advantage of increased shelf life for the solder powder and normal handling of the paste. Alternately, the stannous fluoride coating may be removed prior to preparation of the solder paste.

The carrier or paste vehicle is comprised of several components. One component may be rosin or derivatives thereof. Rosin, the non-steam volatile fraction of pine oleoresin, is a mixture of five isomeric diterpene acids, the most abundant of which is abietic acid. The terminology "rosin and rosin derivatives" includes rosin, the acids in rosin, wood rosin, and any of their derivatives, sold under trademarks such as Stabelite ®, Poly-Pale ®, Dymerex ®, Vinsol ®, etc. The purpose of the rosin is to increase the viscosity of the vehicle to a printing consistency, to act as a flux, and to enhance storage stability. The use of more than 75% of rosin provides vehicles which have a very high viscosity and poor printing properties. A preferred amount of rosin ranges between 0% and 60%.

Another component of the carrier or paste vehicle may be an organic solvent. This is an optional ingredient which may be present in amounts constituting up to 75% of the vehicle. The organic solvent should dissolve the rosin acids. In addition the solvent provides the proper consistency for the carrier or paste vehicle which is to be used in the screen or stencil printable solder paste compositions. If more than 75% solvent is present, the finely divided solder metal will not remain dispersed in the carrier or paste vehicle of the screen or stencil printable solder paste composition. The preferred amount of solvent ranges between 40 and 60%. Any of the common organic solvents may be used; typical solvents include acetone, benzene, toluene, aliphatic alcohols, mineral spirits, carbon tetrachloride, the terpenes (e.g., beta-terpineol), ethylene glycol, glycerol, methyl ethyl ketone, and mixtures thereof.

Another component of the carrier or paste vehicle is a thixotropic agent. This ingredient may be present in amounts constituting 0 to 20% of the carrier or vehicle. Its purpose is to increase the viscosity of the carrier to a printing consistency and to increase the loading capacity of the carrier. The presence of more than 20% thixotropic agent will severely hinder the coalescing power of the carrier or paste vehicle system. A preferred amount of thixotropic agent ranges from 0.5 to 10%. Any thixotropic agent can be used provided that it does not leave an organic solvent (trichloroethylene, Freon ®, etc.) insoluble material on the solder metal after the soldering operation is performed. Common thixotropic agents are disclosed by Eirich, "Rheology", Vol. 4, p. 457. A preferred thixotropic agent is hydrogenated castor oil (Thixatrol ®).

Another component of the carrier or paste vehicle may be an active hydrogen-containing compound. This compound must be active above the melting point of the solder metals to assist in the removal of the surface oxides from the solder metals. The compound should also enhance solder flow, solder wetting, and leave a non-corrosive, electrically conductive residue. Active hydrogen-containing compounds include hydroxyl substituted aliphatic amines in which the hydroxyl and nitrogen are in vicinal relationship, hydroxyl substituted mononuclear aromatic amines in which the hydroxyl and nitrogen are in a vicinal relationship, hydroxyl substituted polynuclear heterocyclic amines in which the hydroxyl is in the two or eight position relative to the ring nitrogen, and mixtures thereof. The term vicinal denotes neighboring or adjoining positions on a carbon ring or chain. Some suitable compounds include diethanolamine, triethanolamine, 2-hydroxyquinoline, 8-hydroxyquinoline, α-hydroxymethyl pyridine, 2-(2-aminoethylamino) ethanol, diglycolamine, and N-hydroxyethyl ethylenediamine. This optional ingredient may be present in the amount of 0 to 75%, preferably 1–10%.

The solder pastes may also contain wetting agents such as soya lecithin and an active hydrogen containing compound which is capable of removing surface oxides from the soldering metals. However using stannous fluoride the active hydrogen containing compound is not required. Other conventional screen printable constituents, viscosity modifiers, etc., may also be present in the printable solder paste compositions of the invention. Common rheology modifiers may be included provided they do not adversely affect the properties of the solder paste.

The stannous fluoride has a melting point in the range of 210°–219° C. Therefore, it is capable of being fluid below soldering temperature, and reacting at a temperature below the solder's liquidus to clean the oxides on the surface of the part to be soldered prior to the soldering operation. Further it has the capability to result in a soldered material with low ionic contamination following the soldering operation. The presence of stannous fluoride provides a greater degree of stability in the handling of the solder paste composition during screen or stencil printing and extends the time within which the solder paste composition may be used. Using stannous fluoride, corrosion of the soldered portion, degradation of electrical insulating properties and other adverse effects are minimized.

A eutectic mixture of stannous fluoride with small amounts of other inorganic fluoride may be made to lower the melting temperature of the stannous fluoride and increase dwell time during the soldering operation.

The carrier or paste vehicle is prepared by simply admixing the components and/or dissolving one component in another. The screen printable solder pastes are conventionally made by admixing the solder metals and the carrier in any ratio, but preferably at ratios between 1:19 to 1:4. Any well known techniques for preparing the paste may be utilized.

In making a solder paste, it is customary to employ about 80 to 95% by weight of the metal or metal alloy solder powder, 4.9 to 19% of the carrier or paste vehicle, and 0.1 to 1% of the stannous fluoride based on the total composition. Preferably 85 to 92% by weight of the metal or metal alloy solder powder, 8 to 15% of the carrier or paste vehicle, and 0.2 to 0.5% of the stannous fluoride based on the total composition are used. The presence and amounts of thickener and thinner, dispersant, etc., are selected by conventional principles. The relative proportions of the various components are selected dependant upon the densities of the various materials present, and particularly upon the density of the solder powder. The amount of stannous fluoride can also be adjusted to compensate for the level of oxides present in the solder powder. The greater the amount of oxides in the solder powder, the larger the loading of stannous fluoride used. This provides a greater degree of control over the formation of solder balls during the soldering operation. There is a correlation between the amount of stannous fluoride and the reflow temperature. Optionally, the reflow temperature should be maintained above the melting temperature of the stannous fluoride.

Printing of the solder paste on metal is by conventional techniques (using screens and stencils). A satisfactory paste should print through an 80-mesh (or finer) screen, but should not drip between printing operations, nor should it dry or stiffen excessively when held on the screen for a reasonable period of time. For satisfactory performance the vehicle properties and paste composition should be adjusted to prevent excessive settling out of the powder, but not interfere with the printing operation.

The screen printable solder paste composition may be applied to any suitable substrate, particularly metal substrates to form a solder pad. Thereafter, the solder is heated to a temperature where the solder becomes molten and a highly adherent solder bond is formed. Any atmosphere may be used, e.g., air but oxidizing atmospheres are preferred.

As previously mentioned an outstanding advantage in use of stannous fluoride in a solder composition is an ability to eliminate a post cleaning operation such as with a chlorofluorocarbon solvent. Considerable efforts are being made to replace such chlorofluorocarbon solvents due to their environmental impact upon the stratosphere. In addition the failure of cleaning agents to completely remove flux residues from hard to reach, tight spots, and from under components in Surface Mount or Fine Pitch assembly operations, makes current cleaning methods and proposed alternative cleaners less effective. The present invention allows a different solution presently undertaken by the soldering industry which is primarily devoted to replacement of one cleaning agent with another one. The cleaning agents function to reduce ionic contamination resulting from the soldering operation. In contrast the present solder paste formulation imparts low ionic contamination which allows formation of a soldered conductive component with soldered connections such as a printed circuit or printed wiring board (i.e., one containing conductive or non-conductive surface portions) without a need for a cleaning operation prior to assembly of the electronic component in a final electronic device.

The following examples wherein the parts and percentages are by weight illustrate but do not limit the invention.

EXAMPLE 1

Batches of solder paste medium, a thinner and a carrier composition were prepared having the compositions outlined below.

Solder paste medium composition:

| Ingredient | Amount (%) |
| --- | --- |
| Terpineol #318, manufactured by Hercules, Wilmington, DE | 33.0 |
| Thixatrol ST, hydrogenated castor-oil, manufactured by NL Industries, Hightstown, NJ | 4.0 |
| Resin Stabelite A-1, modified wood rosin manufactured by Hercules, Wilmington, DE | 43.0 |
| Triethanolamine | 20.0 |

Thinner composition:

| Ingredient | Amount (%) |
| --- | --- |
| Terpineol #318 | 67.0 |
| Triethanolamine | 33.0 |

Carrier composition:

| Ingredient | Amount (%) |
| --- | --- |
| Solder paste medium | 74.5 |
| Thinner | 22.4 |
| Terpineol #318 | 3.1 |

A solder paste composition was prepared using the above carrier composition and solder powder alloy of Sn/Pb/Ag (62/36/2). To 9.8 parts of the carrier 90.2 parts of the powder were added a little at a time to allow complete mixing of the powder. After all the powder was added the paste was stirred for another 20 minutes until a consistent paste mixture suitable for printing was obtained. A stencil 0.01 inch (0.0254 cm) thick, with a hole diameter of 0.25 inch (0.635 cm) was used for printing the paste. Samples of 1.23×0.50 inch (3.12×1.27 cm) and 0.031 inch (0.079 cm) cut from a copper (clad) glass/epoxy laminate were used. Before printing, the samples were prepared by immersing them for 1.5 hours in boiling water. The paste was printed on 9 samples and 3 samples each were reflowed at 230° C., 260° C. and 290° C. The solder pulled to the center of the print forming a large ball, leaving behind a ring of solder balls. The poor surface wetting clearly demonstrated this composition lacks the proper flux action. Reflow was done by floating the samples in a solder pot kept at the temperatures given above.

EXAMPLE 2

Stannous fluoride was ground to a very fine powder using an agate mortar and pestle. The tin fluoride powder was dispersed in the paste given in Example 1. The solder paste in this example was prepared by mixing for 15 min the following ingredients:

| Ingredients | Amount (%) |
| --- | --- |
| Paste from Example 1 | 99.9 |
| Stannous fluoride | 0.1 |

Procedure described in Example 1 was followed for the preparation of the samples and solder paste reflow. At 290° C., the solder coalesced too fast before the tin fluoride flux could remove the tarnish from the substrate. Similarly, at 230° C. which is close to the melting temperature of the tin fluoride, maximum fluxing effect was not achieved. Consequently, the solder reflowed poorly. The optimum temperature was found to be 260° C.

EXAMPLE 3

Example 2 was repeated with the following exception: 0.3% stannous fluoride was used instead of the 0.1% used in Example 2. Improved wetting was achieved at all reflow temperatures. However, the quality of the solder fillet was not optimum.

EXAMPLE 4

Example 2 was repeated with the following exception: 0.5% stannous fluoride was used instead of the 0.1% used in Example 2. Good wetting and excellent solder fillets were obtained at the three selected reflow temperatures.

EXAMPLE 5

Example 2 was repeated with the following exception: 0.7% stannous fluoride was used instead of the 0.1% used in Example 2. Good wetting and excellent solder fillets were obtained at the three selected reflow temperatures.

EXAMPLE 6

Example 1 was repeated with the following exceptions:

TABLE 1

| SAMPLE | PASTE FROM EXAMPLE 1 (%) | STANNOUS FLUORIDE (%) |
|---|---|---|
| 1 | 100 | 0 |
| 2 | 99.9 | 0.1 |
| 3 | 99.7 | 0.3 |
| 4 | 99.5 | 0.5 |
| 5 | 99.3 | 0.7 |

Paste prints were reflowed at 205° C. Solder wetting was acceptable in all 5 samples. However, the quality of the solder fillet improved with the increased loading of tin fluoride.

EXAMPLE 7

Five solder paste compositions were prepared using, solder powder alloy of 95/5 (Sn/Ag), solder paste medium outlined in Example 1 and terpineol #318. To 8.0 parts of the solder paste medium 1.2 parts of terpineol were added. This was stirred for a few minutes. 90.8 parts of the solder powder were added a little at a time until all the powder mixed well. The paste was mixed for an additional 15 minutes until a consistent paste, suitable for printing was formed. Stannous fluoride, in the amounts shown in Table 2 below, was then added to the paste formulations.

TABLE 2

| SAMPLE | PASTE (%) | STANNOUS FLUORIDE (%) |
|---|---|---|
| 1 | 100 | 0 |
| 2 | 99.9 | 0.1 |
| 3 | 99.7 | 0.3 |
| 4 | 99.5 | 0.5 |
| 5 | 99.3 | 0.7 |

Paste printed on samples described above were reflowed at 246° C., 276° C. and 306° C. Solder wetting was acceptable for all 5 samples. The quality of the solder fillet improved with increased loading of the stannous fluoride. There was no noticeable difference in the effect of reflow temperature.

EXAMPLE 8

Ten 2×2 inch (5.08×5.08 cm) copper clad glass epoxy boards, 0.031 inch (0.079 cm) thick, were cleaned by rinsing with spectroscopy grade acetone. A group of 5 of these boards was vapor coated with stannous fluoride in a vacuum and the second group of five boards was used as a control. The stannous fluoride coated boards were placed on a copper foil that was floated on a solder pot which was maintained at a temperature of 250° C. The boards were left on the foil for 90 minutes. Ionic contamination measurements were on both groups of coated and uncoated boards using the Military Specification method MIL-P-28809. Both groups of boards gave identical ionic measurements of 2 micrograms NaCl equivalent/sq. inch which was the lowest measurement obtainable using this method of measurement and measuring device.

What is claimed is:

1. An improved solder paste composition suitable for screen or stencil printing with a capability for low ionic contamination after use of the paste in a soldering operation comprising
    (a) a metal or metal alloy,
    (b) a carrier, and
    (c) stannous fluoride which composition after soldering and without a cleaning step has an ionic contamination not greater than 2 micrograms NaCl equivalent/sq. inch.

2. The improved solder paste composition according to claim 1 wherein the stannous fluoride is present in the amount of 0.1 to 1% by weight based on the total composition.

3. The improved solder paste composition according to claim 1 wherein the metal or metal alloy is selected from the group consisting of gold, silver, tin, germanium, silicon, antimony, bismuth, lead, indium, gallium, zinc, copper, phosphorous and an alloy or mixture thereof.

4. The improved solder paste composition according to claim 1 wherein the metal alloy is about 36% lead, 62% tin, and 2% silver, 90% lead and 10% tin or 95% tin and 5% silver by weight.

5. The improved solder paste composition according to claim 3 wherein the metal or metal alloy is present in the amount of 80 to 95% by weight based on the total composition.

6. The improved solder paste composition according to claim 1 wherein the carrier is comprised of a rosin or rosin derivative.

7. The improved solder paste composition according to claim 6 wherein the carrier is a wood rosin.

8. The improved solder paste composition according to claim 6 wherein the carrier further comprises a thixotropic agent.

9. The improved solder paste composition according to claim 8 wherein the thixotropic agent is a hydrogenated castor oil.

10. The improved solder paste composition according to claim 6 wherein the carrier further comprises an organic solvent.

11. The improved solder paste composition according to claim 10 wherein the organic solvent is beta-terpineol.

12. The improved solder paste composition according to claim 6 wherein the carrier further comprises an active hydrogen-containing compound.

13. The improved solder paste composition according to claim 12 wherein the hydrogen-containing compound is triethanolamine.

14. The improved solder paste composition according to claim 12 wherein the hydrogen-containing compound is present in the amount of 1 to 10% by weight based on the carrier.

15. The improved solder paste composition according to claim 1 wherein the metal or metal alloy has a coating of stannous fluoride.

16. The improved solder paste composition according to claim 15 wherein the coating of stannous fluoride is a partial coating.

17. The improved solder paste composition according to claim 15 wherein the coating of stannous fluoride is a complete coating.

18. The process for soldering a substrate surface in the absence of a separate operation requiring application of a flux comprising the step of applying a solder paste composition to said surface which has not been coated or treated with a flux wherein the solder paste comprises.

(a) a metal or metal alloy,
(b) a carrier, and
(c) stannous fluoride which composition after soldering and without a cleaning step has an ionic contamination not greater than 2 micrograms NaCl equivalent/sq. inch.

19. The process of claim 18 wherein the solder paste composition is applied by screen or stencil printing.

20. A process for making and assembling an electronic device containing at least one soldered electronically conductive component comprising the steps of
(a) forming an electronically conductive component with soldered connections with the component containing conductive and nonconductive surface area by application onto conductive surface areas of a solder paste comprising a metal or metal alloy, a carrier and stannous fluoride
(b) assembling the soldered electronically conductive component into an electronic device in the absence of any solder cleaning operation between steps (a) and (b).

* * * * *